United States Patent
Kinoshita et al.

(10) Patent No.: US 8,238,391 B2
(45) Date of Patent: Aug. 7, 2012

(54) P-TYPE GROUP III NITRIDE SEMICONDUCTOR AND GROUP III NITRIDE SEMICONDUCTOR ELEMENT

(75) Inventors: Toru Kinoshita, Tsukuba (JP); Hiroyuki Yanagi, Tsukuba (JP); Kazuya Takada, Tokyo (JP)

(73) Assignee: Tokuyama Corporation, Shunan-Shi (JP)

( * ) Notice: Subject to any disclaimer, the term of this patent is extended or adjusted under 35 U.S.C. 154(b) by 262 days.

(21) Appl. No.: 12/532,564

(22) PCT Filed: Mar. 21, 2008

(86) PCT No.: PCT/JP2008/055277
§ 371 (c)(1),
(2), (4) Date: Sep. 22, 2009

(87) PCT Pub. No.: WO2008/117750
PCT Pub. Date: Oct. 2, 2008

(65) Prior Publication Data
US 2011/0128981 A1 Jun. 2, 2011

(30) Foreign Application Priority Data
Mar. 23, 2007 (JP) .................. 2007-077449

(51) Int. Cl.
*H01S 3/04* (2006.01)
*H01S 5/00* (2006.01)
(52) U.S. Cl. ............. 372/35; 372/43.01; 372/36; 372/34
(58) Field of Classification Search ............... 372/43.01, 372/45.01
See application file for complete search history.

(56) References Cited

U.S. PATENT DOCUMENTS
2004/0211967 A1* 10/2004 Hirayama et al. ............... 257/79
2007/0008998 A1* 1/2007 Ohta et al. ................. 372/43.01

FOREIGN PATENT DOCUMENTS
| EP | 902487 A2 | 3/1999 |
| JP | 03-284833 A | 12/1991 |
| JP | 11-233825 A | 8/1999 |
| JP | 2001-11901 A | 4/2001 |
| JP | 2004-228489 A | 8/2004 |
| JP | 2006-269773 A | 10/2006 |
| JP | 2007-019277 A | 1/2007 |

OTHER PUBLICATIONS

Japanese Office Action dated Mar. 21, 2012 issued in corresponding Japanese patent application No. 2009-506322 (English translation is attached).

* cited by examiner

*Primary Examiner* — Patrick Stafford
(74) *Attorney, Agent, or Firm* — Birch, Stewart, Kolasch & Birch, LLP

(57) ABSTRACT

This invention provides a p-type group III nitride semiconductor, with good p-type properties, having a composition expressed by $Al_XGa_YIn_ZN$ in which each of X, Y and Z indicates a rational number satisfying a relationship of $X+Y+Z=1.0$, even if Al content is as high as $1.0 > X \geqq 0.5$. It is achieved that a proportion of a hole concentration at 30° C. to an acceptor impurity atom concentration is 0.001 or more in the p-type group III nitride semiconductor of the invention, by doping acceptor impurity atoms such as Mg in concentration of $5 \times 10^{18}$ to $1 \times 10^{20}$ cm$^{-3}$ using the method, for example, MOCVD with attention not to incorporate an impurity atom other than the acceptor impurity atom or not to form dislocation in the crystal when producing the group III nitride semiconductor expressed by the above composition.

12 Claims, 3 Drawing Sheets

P-TYPE GROUP III NITRIDE SEMICONDUCTOR AND GROUP III NITRIDE SEMICONDUCTOR ELEMENT

TECHNICAL FIELD

The present invention relates to a p-type group III nitride semiconductor, utilizable in an ultraviolet luminescence device (such as light emitting diode and laser diode), an ultraviolet sensor, etc., and having high Al content (50 atom % or more of group III elements is Al), and a semiconductor element obtained by using the same.

BACKGROUND ART

A group III nitride semiconductor typified by gallium nitride (GaN) has a direct transition type band structure in a full spectrum of energy band corresponding to visible region through ultraviolet region, and allows production of highly-effective light emitting device. Therefore, the light emitting diode and laser diode have been studied actively, and light emitting diode from visible region to near-ultraviolet region and blue laser diode, etc. are currently commercialized. In the production of such a device, production techniques for p-type GaN are very important, and good p-type conductivity has been achieved for GaN, in which the hole concentration is $10^{18}$ cm$^{-3}$.

On the other hand, for achieving light emitting diode and laser diode glowing in the deep ultraviolet region of 300 nm or less, it is necessary to attain p-type conduction of a group III nitride semiconductor with high Al content such as a group III nitride semiconductor with composition expressed by $Al_X Ga_Y In_Z N$ (where X, Y, and Z are rational number satisfying a relationship of X+Y+Z=1), which satisfies $1.0 > X \geq 0.5$. However, increased Al content makes it very difficult to attain p-type conduction.

The causes may be that activation energy (acceptor level) of acceptor impurity atom increases with increase in Al content, and also that carrier compensation is occurred due to introducing many donor defects in crystals. For example, the acceptor level of Mg in GaN is around 150 meV while the same in AlN is around 500 meV (see Non-Patent Documents 1 and 2). Also, according to Non-Patent Document 3, activation energy ($E_A$) of Mg in AlGaN, in which Al proportion (hereinafter referred to as Al composition) in the group III elements is 70% (where X=0.7 and Z=0 in the above formula), is estimated at around 400 meV, and resistivity value ($\rho$) is said to follow the following equation as a function of temperature.

$$\rho(T) = \rho_0 \exp(E_A/kT)$$

Non-Patent Document 3 reports that resistivity value of the above sample is 40 Ωcm at 800K, but resistivity value is exponentially increased according to the above equation as temperature decreases, and it goes into a semi-insulating state of $10^5$ Ωcm at around room temperature.

[Non-Patent Document 1] J. Crystal Growth 189 (1998) 528

[Non-Patent Document 2] Appl. Phys. Lett. 89 (2006) 152120

[Non-Patent Document 3] Appl. Phys. Lett. 86 (2005) 092108

DISCLOSURE OF INVENTION

Problem to be Solved by the Invention

According to the assumption shown in Non-Patent Document 3, for example, when trying to obtain a hole concentration of $10^{16}$ cm$^{-3}$ or more in $Al_X Ga_Y In_Z N$ with Al composition of 70% (X=0.7), it is necessary to dope acceptor impurity atom in high concentration of $10^{21}$ cm$^{-3}$ or more. However, when doping in high concentration of $10^{21}$ cm$^{-3}$ or more, many crystal defects are introduced in the $Al_X Ga_Y In_Z N$ crystal due to doping, and donor-type compensation center is formed. As a result, it is difficult to attain high hole concentration.

In a semiconductor device such as light emitting diode and laser diode which requires high current density, higher carrier concentration is desirable. However, because of the above-mentioned reasons, it is difficult even to achieve clear p-type properties when Al composition is 50% or more. Therefore, it is extremely difficult to produce highly-effective device. Then, this makes it very difficult to increase efficiency of a semiconductor device requiring p-type $Al_X Ga_Y In_Z N$ with high Al composition, such as light emitting device in short-wavelength of 300 nm or less.

Consequently, the purpose of the present invention is to provide a p-type group III nitride semiconductor, wherein acceptor impurity atom is doped to $Al_X Ga_Y In_Z N$ with Al composition of 50% or more ($X \geq 0.5$), showing good p-type properties.

Means for Solving the Problem

To solve the above problems, the present inventors manufactured a number of p-type group III nitride semiconductors varying acceptor impurity atom concentrations and Al compositions by using metal organic chemical vapor deposition method (MOCVD), and studied properties thereof in detail. As a result, it was found that electric characterization does not follow the relations shown in Non-Patent Document 3 in a range of specific acceptor impurity atom concentration lower than the acceptor impurity atom concentration (about 1.5× $10^{20}$ cm$^{-3}$) of the sample disclosed in Non-Patent Document 3, and that hole formation efficiency due to acceptor impurity atom is increased, showing good p-type properties, so that the present invention has been achieved.

Namely, the first aspect of the present invention is a p-type group III nitride semiconductor, characterized in that an acceptor impurity atom in a concentration of $5 \times 10^{18}$ to $1 \times 10^{20}$ cm$^{-1}$ is doped in a group III nitride semiconductor having a composition expressed by $Al_X In_Y Ga_Z N$, wherein each of X, Y and Z indicates a rational number satisfying $1.0 > X \geq 0.5$, $0.5 \geq Y \geq 0.0$ and $0.5 \geq Z \geq 0.0$ and satisfies a relationship of X+Y+Z=1.0, and a proportion of hole concentration to an acceptor impurity atom concentration at 30° C. is 0.001 or more.

As mentioned above, Non-Patent Document 3 discloses that resistivity value ($\rho$) follows the Arrhenius equation when an acceptor impurity atom is doped in a group III nitride semiconductor with high Al content to obtain a p-type semiconductor. Then, it has been believed that it is substantially impossible to attain low resistivity value at around room temperature in view of the experimentally-obtained activation energy. In the p-type group III nitride semiconductor of the present invention, defying the above common knowledge, hole formation efficiency due to acceptor impurity atom is increased by making the acceptor impurity atom concentration within the specific range, which results in successfully obtaining good p-type properties.

Although a mechanism for obtaining such a remarkable effect is not exactly clearly understood, the present inventors suppose that relaxation occurs in a crystal structure when the acceptor impurity atom concentration is within the specific range, allowing hopping conduction as found in an amorphous, semiconductor. This is because there is a good correlation with a degree of a crystal lattice deformation (a degree of relaxation) caused by doping of the acceptor impurity atom. Note that resistivity value and hole concentration are not necessarily correlated with the acceptor impurity atom concentration in either one of positive or negative direction and the direction may sometimes be reversed, as shown in results of the following examples and comparative examples.

However, p-type semiconductor properties such as the resistivity value and hole concentration are not only unambiguously determined merely by the above degree of relaxation, but also influenced by the acceptor impurity atom concentration itself as well as structural defects, such as dislocation and vacancy, and "donor-type compensation center" formed by incorporation of the impurity atom. This is supported by the experimental fact that resistivity may vary greatly depending on the differences in crystal growth conditions even when the acceptor impurity atom concentration, which is main determinant of the degree of deformation (degree of relaxation) of crystal lattice, is maintained constant.

Although the p-type group III nitride semiconductor of the present invention is supposed to be determined by such various factors, unfortunately, techniques have not been established yet to provide quantitative determination of an amount and existence form of the above "donor-type compensation center". Also, it is substantially impossible to provide quantitative determination of the determinant factor and its effect, as well as "various factors having negative effects on p-type semiconductor properties" except for "donor-type compensation center" and the effects. The factors having negative effects on p-type semiconductor properties are considered to work for eliminating holes formed by doping of the acceptor impurity atom in an ideal crystal. Consequently, the following two properties are used for specifying a p-type group III nitride semiconductor in the present invention: the concentration of "acceptor impurity atom" directly relating to hole formation and mainly causing the above "relaxation", and "proportion of hole concentration to acceptor impurity atom concentration" reflecting the above negative effects in a comprehensive way.

Note that as the above p-type group III nitride semiconductor of the present invention, those with resistivity value at 30° C. of $5 \times 10^3$ Ωcm or less or those with hole concentration at 30° C. of $5 \times 10^{15}$ cm$^{-3}$ or more are preferable. Further, it is preferable that "A1" is larger than "A2" by 0.10% or more, or that "C1" is smaller than "C2" by 0.05% or more when an a-axis lattice constant and a c-axis lattice constant of the p-type group III nitride semiconductor of the present invention are defined as "A1" and "C1" respectively, and when an a-axis lattice constant and a c-axis lattice constant of a group III nitride semiconductor having same composition as said p-type group III nitride semiconductor but including no acceptor impurity atom are defined as "A2" and "C2" respectively. Also, the p-type group III nitride semiconductor of the first aspect of the present invention is preferably manufactured by a metal organic chemical vapor deposition method.

Also, the second aspect of the present invention is a semiconductor element, comprising at least one layer comprising the p-type group III nitride semiconductor of the above first aspect of the present invention.

Effects of the Invention

According to the present invention, there is provided a p-type group III nitride semiconductor based on a group III nitride semiconductor with high Al content expressed by a formula $Al_X Ga_Y In_Z N$ satisfying a relationship of $X \geq 0.5$, such as a p-type group III nitride semiconductor showing good p-type properties wherein a resistivity value at 30° C. is $5 \times 10^3$ Ωcm or less and a hole concentration at 30° C. is $5 \times 10^{15}$ cm$^{-3}$ or more, for example. By using the p-type group III nitride semiconductor of the present invention in a semiconductor device such as light emitting diode and laser diode, efficiency of the semiconductor device can be improved.

BEST MODE FOR WORKING THE INVENTION

Figure 1:
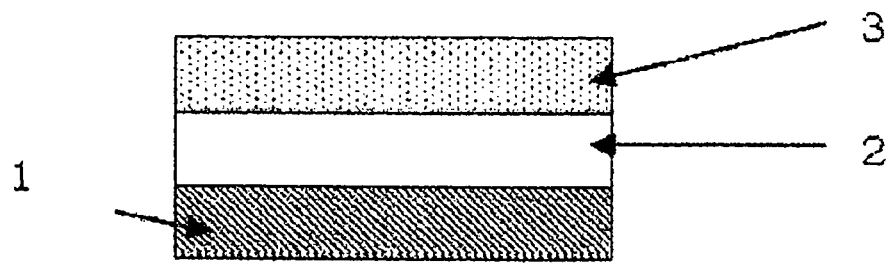
FIG. 1 is a schematic view showing a cross-section of a laminated body obtained by forming a buffer layer comprised of a laminated structure of group III nitride films on a sapphire substrate by MOCVD, and further forming a p-type group III nitride semiconductor of the present invention thereon by MOCVD.

Hereinafter, the present invention will be described based on an embodiment shown in the drawings.

A p-type group III nitride semiconductor of the present invention is obtained by doping an acceptor impurity atom in a concentration of $5 \times 10^{18}$ to $1 \times 10^{20}$ cm$^{-3}$ to a group III nitride semiconductor having a composition expressed by $Al_X In_Y Ga_Z N$ (where each of X, Y and Z indicates a rational number satisfying $1.0 > X \geq 0.5$, $0.5 \geq Y \geq 0.0$ and $0.5 \geq Z \geq 0.0$, and satisfies a relationship of $X+Y+Z=1.0$), wherein a proportion of hole concentration to an acceptor impurity atom concentration at 30° C. is 0.001 or more. For a p-type group III nitride semiconductor wherein an acceptor impurity atom is doped to a group III nitride semiconductor having a high concentration of Al content represented as X of 0.5 or more in the above composition formula, there is not yet known the one wherein hole concentration at 30° C. is high and 0.001 or more times larger than an acceptor impurity atom concentration.

The group III nitride semiconductor as a base of the p-type group III nitride semiconductor of the present invention may be any expressed by the above composition, and it is preferable to be crystalline material, particularly single crystal. Also, as for its composition, because of ease of production, X, Y and Z in the above composition formula preferably satisfy a relationship of $0.9 > X \geq 0.5$, $0.5 \geq Y \geq 0.1$ and $0.1 \geq Z \geq 0$, particularly preferably a relationship of $0.8 > X 0.6$, $0.4 \geq Y \geq 0.2$ and $0.05 \geq Z \geq 0$.

Note that contents of Al, In, Ga and N can be measured by secondary ion mass spectrometry, etc.

The p-type group III nitride semiconductor of the present invention includes an acceptor impurity atom in a concentration of $5\times10^{18}$ to $1\times10^{20}$ cm$^{-3}$. When the acceptor impurity atom concentration is out of the above range, no crystal lattice deformation occurs to cause hopping conduction, and it is impossible to obtain good p-type semiconductor properties even in an ideal crystal state by optimizing crystal growth conditions. In the p-type group III nitride semiconductor of the present invention, for example, low resistivity value of $5\times10^3$ Ωcm or less can be attained at around 30° C. However, it is conventionally considered to theoretically need to dope an acceptor impurity atom in a high concentration of $1\times10^{21}$ cm$^{-3}$ or more to form holes for obtaining such a resistivity value. Namely, with an acceptor impurity atom in a lower concentration by single-digit or more, the present invention attains higher conductive properties than conventionally obtained.

As the acceptor impurity atom included in the p-type group III nitride semiconductor of the present invention, Mg, Zn, Ca, Cd, Be, etc. can be used. Among these, Mg is preferable to use since ionization energy of the acceptor impurity atom is small and concentration control is relatively easy. The acceptor impurity atom concentration may be in a range of $5\times10^{18}$ to $1\times10^{28}$ cm$^{-3}$, and is preferably $1.6\times10^{19}$ to $7\times10^{19}$ cm$^{-3}$, particularly preferably $2\times10^{19}$ to $5\times10^{19}$ cm$^{-3}$, for stably obtaining high hole concentration. When the acceptor impurity atom concentration is within the range of $5\times10^{18}$ to $1.5\times10^{19}$ cm$^{-3}$, crystal lattice deformation due to introduction of the acceptor impurity atom is relatively small, and also, influences due to small changes in crystal growth conditions are relatively large. Therefore, even when producing a p-type group III nitride semiconductor in the same procedures, deformation volume may vary and desired deformation may not be obtained.

The hole concentration of the p-type group III nitride semiconductor of the present invention at 30° C. is more than 0.001 times, preferably more than 0.0015 times and most preferably more than 0.002 times larger than the acceptor impurity atom concentration. The hole concentration at 30° C. can be measured by a known Hall effect measurement wherein hole concentration is calculated from a resistivity value and a Hall induced voltage.

As described above, the hole concentration is considered to be determined by influences of acceptor impurity atom concentration and various structural factors, but the mechanism is unknown. Therefore, "a proportion of hole concentration at 30° C. to an acceptor impurity atom concentration" is used to indirectly determine such a structural characteristic in the present invention.

In the p-type group III nitride semiconductor of the present invention, dislocation density is preferably $10^{10}$ cm$^{-2}$ or less, particularly preferably $10^9$ cm$^{-2}$ or less, and oxygen concentration is preferably $10^{18}$ cm$^{-3}$ or less, particularly preferably $10^{17}$ cm$^{-3}$ or less, in view of inhibiting formation of "donor-type compensation center". Note that the dislocation density can be measured by plane cross section observation via a transmission electron microscope. Also, oxygen concentration can be measured by secondary ion mass spectrometry.

As a result of X-ray diffraction analysis for crystal structure of the p-type group III nitride semiconductor of the present invention actually produced by MOCVD, it was confirmed that the a-axis lattice constant and c-axis lattice constant change from an a-axis lattice constant and a c-axis lattice constant of a group III nitride semiconductor having same composition but including no acceptor impurity atom (a group III nitride semiconductor manufactured in the same procedures except for not doping an acceptor impurity atom).

Namely, it was confirmed that "A1" is larger than "A2" by 0.10% or more or that "C1" is smaller than "C2" by 0.05% or more when an a-axis lattice constant and a c-axis lattice constant of the p-type group III nitride semiconductor of the present invention are defined as "A1" and "C1" respectively, and when an a-axis lattice constant and a c-axis lattice constant of a group III nitride semiconductor having same composition but including no acceptor impurity atom are defined as "A2" and "C2" respectively. From this observation, it would appear that hopping conduction occurs at around 30° C. in the p-type group III nitride semiconductor of the present invention, as observed in amorphous semiconductor.

Namely, it was believed in the past that hole conduction was caused by thermal excitation from a certain acceptor level determined by the composition of group III nitride in the p-type group III nitride semiconductor. On the other hand, in the p-type group III nitride semiconductor of the present invention, (1) conduction caused by the above conventional thermal excitation is dominant in a range of 200° C. or more, and (2) activation energy of the acceptor impurity atom is remarkably lower than the activation energy expected based on the above conventional mechanism in a range of around 30° C. to 200° C., which is much as low as 200 meV or less, for example. As a result, concentration of the acceptor impurity atom, which effectively functions as an acceptor, may be increased.

In the conduction mechanism in the above (2) temperature range, energy band (impurity band) is formed due to the acceptor impurity atom in the p-type group III nitride semiconductor, and the conduction mechanism to cause hole conduction via localized state in the impurity band is considered dominant (NobuoMikoshiba, "Handotai no Butsuri (Semiconductor Physics) [revised edition]"). Then, the present invention succeeds in purposely activating such a mechanism by maintaining the acceptor impurity atom concentration within the specific range and optimizing various crystal growth conditions in MOCVD. As a result, activation energy at around 30° C. is considerably reduced, and holes are formed in a concentration as high as, for example, $5\times10^{15}$ cm$^{-3}$ or more to Mg concentration (acceptor impurity atom concentration) at activation rate as high as 0.001 or more, resulting in resistivity value as low as $5\times10^3$ Ω·cm or less, for example.

Note that "change ratio of a-axis crystal lattice constant" defined by a relationship of $[(A1-A2)/A1]\times100$ is preferably 0.10% to 1.0%, particularly preferably 0.2 to 0.5%, and also "change ratio of c-axis crystal lattice constant" defined by a relationship of $[(C1-C2)/C1]\times100$ is preferably −0.05% to −0.5%, particularly preferably −0.10 to −0.3%, in the p-type group III nitride semiconductor of the present invention since the above (2) mechanism is easily attained.

The p-type group III nitride semiconductor of the present invention can be preferably manufactured by MOCVD. However, even when using MOCVD and controlling the acceptor impurity atom concentration within the predetermined range, it may be impossible to obtain the p-type group III nitride semiconductor of the present invention depending on manufacturing conditions. Therefore, it is necessary to select manufacturing conditions with attention not to incorporate an impurity atom other than the acceptor impurity atom or not to form dislocation in the crystal during manufacturing.

When manufacturing the p-type group III nitride semiconductor of the present invention by MOCVD, the p-type group III nitride semiconductor of the present invention having the predetermined composition is grown on a surface of a substrate for crystal growth. As the substrate for crystal growth, for example, thermally-stable material resistant to temperature history during a film formation step, such as sapphire, SiC, Si, GaN, AlN, AlGaN, ZnO and $ZrB_2$, and specifically, it is preferable to use thermally-stable material having a melting point or decomposition temperature of at least 1000° C. or more.

Also, it is preferable to preliminarily form a buffer layer on the above substrate. Material and layer structure of the buffer layer are not particularly limited as long as these are the constitution to inhibit generation of N defect as compensation center of the acceptor impurity atom of the p-type group III nitride semiconductor of the present invention grown on the buffer layer. Also, when using the p-type group III nitride semiconductor of the present invention as a p-type layer constituting a device such as light emitting device, it may be formed on a N-type layer or an emission layer such as quantum well structure.

As group III raw materials, group V raw materials and acceptor impurity raw materials used for MOCVD, any raw materials can be used without particular limitation, which are known to be used for forming a p-type group III nitride semiconductor depending on the composition of p-type $Al_XGa_YIn_ZN$. As the group III raw materials, it is preferable to use trimethylaluminum or triethylaluminum, and trimethylgallium, triethylgallium or trimethylindium. Also, as the group V raw materials and the acceptor impurity raw materials, it is preferable to use ammonia and bis(cyclopentadienyl) magnesium, respectively.

Hereinafter, one example will be explained in detail in reference to FIG. 1, in which a buffer layer comprising laminated structure of a group III nitride film is formed on a sapphire substrate by MOCVD, and the p-type group III nitride semiconductor of the present invention is formed further thereon by MOCVD.

In the above example, after placing the sapphire substrate 1 in a MOCVD system, the substrate is first heated to 1050° C. or more, further preferably 1150° C. or more, and held in a hydrogen atmosphere to perform cleaning the substrate surface. Then, trimethylaluminum, trimethylgallium, ammonia, and carrier gas of raw material gas such as hydrogen and nitrogen are introduced in the MOCVD system at 1050° C. or more, further preferably 1150° C. or more, so that the group III nitride buffer layer 2 is formed.

The group III nitride buffer layer 2 may have crystal characteristic at least not spoiling properties of the p-type group III nitride semiconductor layer 3 of the present invention laminated on the buffer layer. It is preferable that half bandwidths of (002) and (102) planes are 500 arcsec or less and 2000 arcsec or less, respectively, in X-ray rocking curve measurement, and further that emission intensity caused by group III or group V defect and impurity etc. is minimized in photoluminescence (PL) measurement etc.

Next, in addition to the above group III and group V raw materials and carrier gas, bis (cyclopentadienyl) magnesium is introduced in the MOCVD system to form an $Al_XGa_YIn_ZN$ layer 3 to which Mg is doped as the acceptor impurity atom. The flow of bis (cyclopentadienyl) magnesium here is controlled so as to make Mg concentration in the $Al_XGa_YIn_ZN$ layer within a range of $5.0 \times 10^{18}$ to $1.0 \times 10^{20}$ $cm^{-3}$, further preferably within a range of $2.0 \times 10^{19}$ to $5.0 \times 10^{19}$ $cm^{-3}$.

It is desirable to control growth temperature, V/III ratio and growth rate when forming a Mg-doping layer here so as to minimize emission caused by impurity in PL measurement after growth. Specifically, it is preferable to set the growth temperature in a range of 1050 to 1150° C., the V/III ratio in a range of 1000 to 4000, and the growth rate in a range of 0.5 to 1.5 μm/hr. When deviating from the above conditions, high p-type semiconductor properties may not be obtained even when controlling the acceptor impurity atom concentration within the predetermined range.

The p-type group III nitride semiconductor of the present invention obtained by such a method has good p-type semiconductor properties, so that it can be preferably used as a p-type clad layer of a light emitting device based on the group III nitride semiconductor. It is also possible to manufacture a light emitting diode and laser diode that emits light in the deep ultraviolet region of 300 nm or less by using the p-type group III nitride semiconductor of the present invention.

EXAMPLE

Hereinafter, the present invention will be explained in detail according to examples and comparative examples, but the present invention is not limited to these examples.

Example 1

A sapphire C-plane single crystal substrate was used for a crystal substrate for growth. After placing it on a susceptor in a MOCVD system, the sapphire substrate was heated to 1150° C. and held for 10 minutes while running hydrogen at a flow of 13 slm, for surface cleaning. Next, an AlN film was formed to have a thickness of 0.45 μm under conditions of temperature of the sapphire substrate at 1150° C., trimethylaluminum flow rate at 15 μmol/min, ammonia flow of 1 slm, entire flow of 10 slm and pressure at 50 Torr.

Then, an $Al_{0.7}Ga_{0.3}N$ buffer layer was formed to have a thickness of 0.4 μm under conditions of the temperature of the sapphire substrate at 1120° C., trimethylgallium flow rate at 10 μmol/min, trimethylaluminum flow rate at 15 μmol/min, ammonia flow of 1.5 slm, entire flow of 10 slm and pressure at 50 Torr.

Next, a Mg-doping $Al_{0.7}Ga_{0.3}N$ layer was formed to have a thickness of 0.5 μm under the same conditions as in forming the buffer layer except for simultaneously supplying bis(cyclopentadienyl) magnesium in condition of 0.8 μmol/min.

The substrate was taken out from the MOCVD system, followed by X-ray reciprocal lattice mapping measurement in (204) plane by using high-resolution X-ray diffraction analysis system (X'Pert made by Spectris Co, Ltd., PANalytical division) under conditions of accelerating voltage at 45 kV and accelerating current at 40 mA. Then, the substrate was cut into several square-shaped samples with about 7 mm square, followed by heat treatment in a nitrogen atmosphere for 20 minutes at 800° C.

Randomly-selected one of the heat-treated substrate samples was subject to quantitative analysis of Mg by secondary ion mass spectrometry using cesium ion as primary ion. Mg concentration was determined based on nitrogen secondary ion intensity of the GaN standard sample. Next, a Ni (20 nm)/Au (100 nm) electrode was formed by a vacuum deposition method, followed by heat treatment in a nitrogen atmosphere for 5 minutes at 500° C. After forming the electrode, Hall measurement was performed by using Hall effect measurement system (Resitest 8300 made by Toyo Corporation) under conditions of current value at $1 \times 10^{-7}$ to $1 \times 10^{-4}$ A, frequency at 50 to 100 mHz, magnetic field at 0.38 T and measurement temperature at 30 to 525° C.

Figure 2:
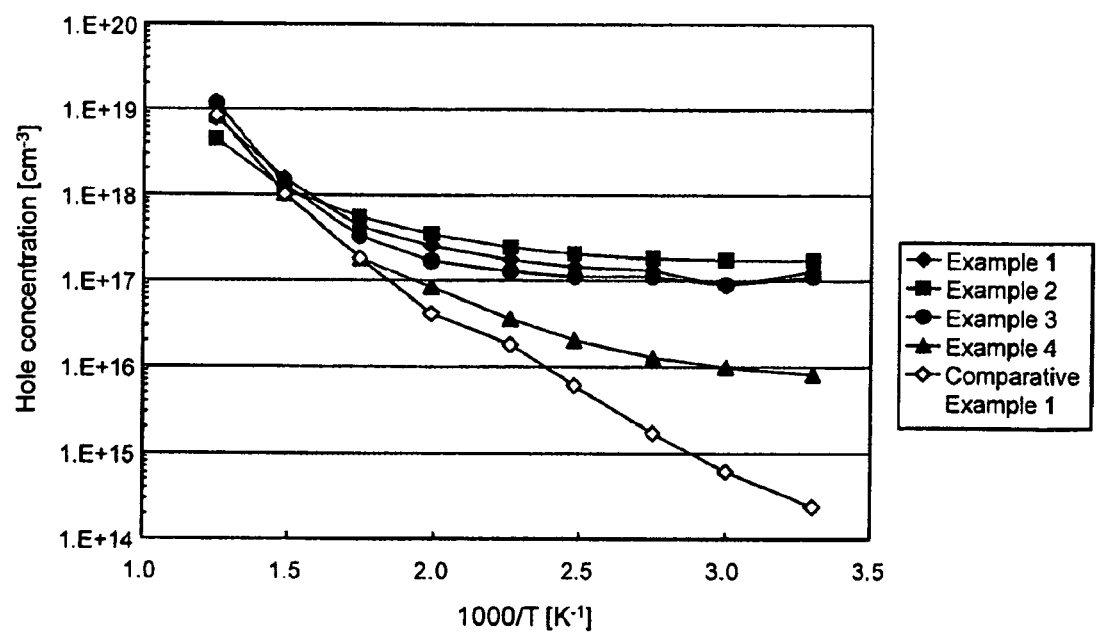
FIG. 2 is a graph showing a relationship of a hole concentration of the p-type group III nitride semiconductor with inverse of temperature for each of the examples and comparative examples.
Figure 3:
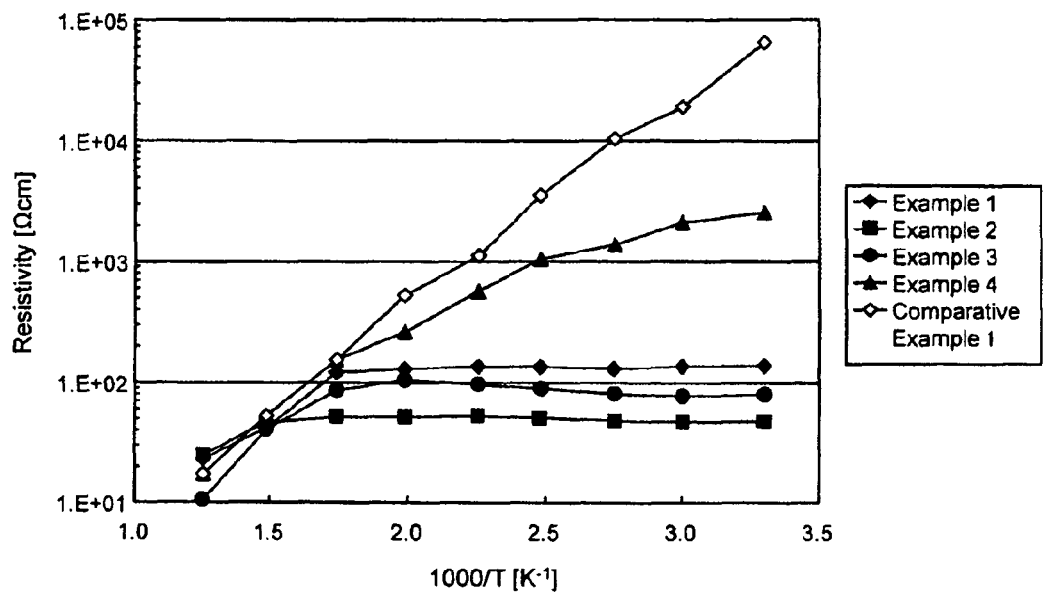
FIG. 3 is a graph showing a relationship of a resistivity of the p-type group III nitride semiconductor with inverse of temperature for each of the examples and comparative examples.

The activation energy of Mg and activation rate of Mg (proportion of hole concentration to Mg concentration) obtained by Hall measurement, and plots of hole concentration and resistivity value to measurement temperature are shown in Table 1, and FIGS. 2 and 3, respectively.

Figure 5:
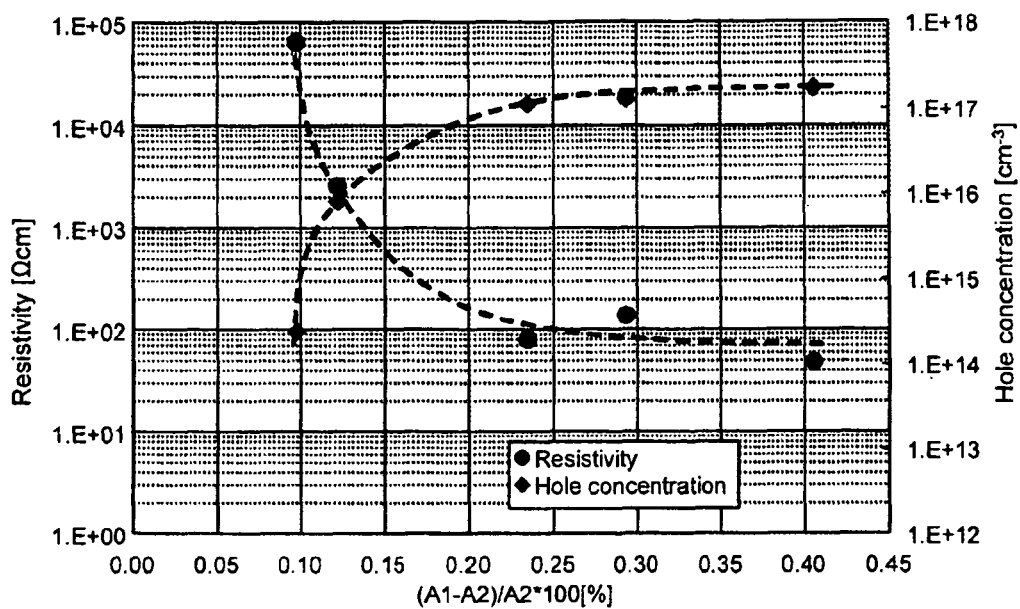
FIG. 5 is a graph showing a relationship of $[(A1-A2)/A1] \times 100$ of the p-type group III nitride semiconductor (horizontal axis) with a resistivity (vertical axis) for each of the examples and comparative examples.
Figure 6:
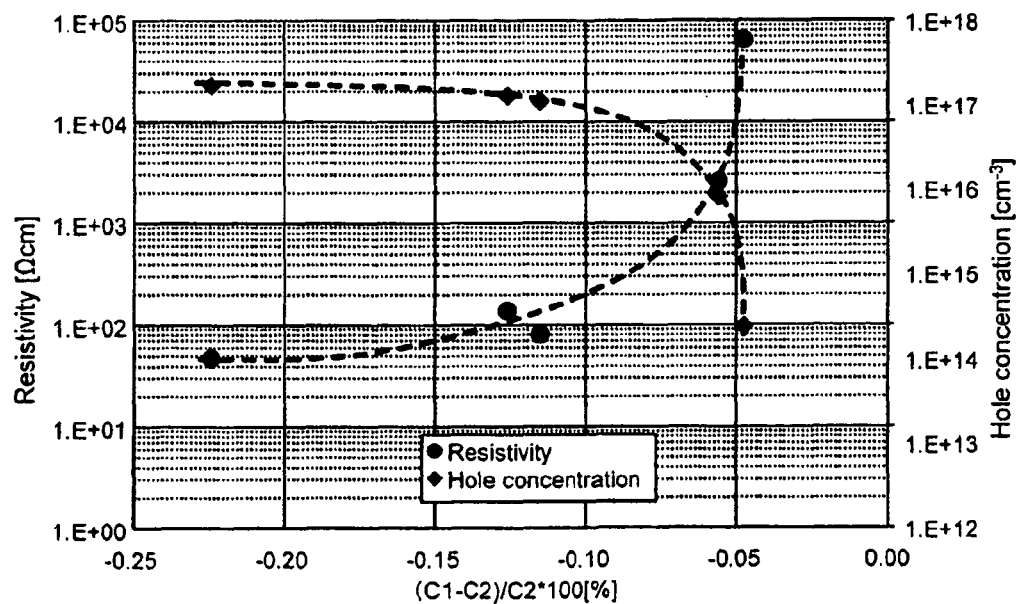
FIG. 6 is a graph showing a relationship of $[(C1-C2)/C1] \times 100$ of the p-type group III nitride semiconductor (horizontal axis) with a resistivity (vertical axis) for each of the examples and comparative examples.

Also, "change ratio of a-axis crystal lattice constant" and "change ratio of c-axis crystal lattice constant" calculated from a difference in lattice constants of the undoped buffer layer and the Mg-doping layer obtained by X-ray reciprocal lattice mapping measurements are shown in Table 2 as well as Mg concentration obtained by secondary ion mass spectrometry (SIMS measurement). Plots of hole concentration and resistivity value to the above difference in lattice constants are shown in FIG. 5 and FIG. 6.

TABLE 1

|  | Ea(T1) | Ea(T2) | Hole concentration**/ Mg concentration |
|---|---|---|---|
| Example 1 | 51 | 403 | $3.63 \times 10^{-3}$ |
| Example 2 | 39 | 360 | $6.07 \times 10^{-3}$ |
| Example 3 | 30 | 491 | $4.34 \times 10^{-3}$ |
| Example 4 | 151 | 543 | $1.04 \times 10^{-3}$ |
| Comperative Example 1 | 367 | 530 | $1.58 \times 10^{-5}$ |
| Comperative Example 2 | 401 | 596 | $4.84 \times 10^{-7}$ |
| Comperative Example 3 | 438 | 512 | $9.24 \times 10^{-5}$ |

**hole concentration at 30° C.

TABLE 2

|  | Evaluation Items | | |
|---|---|---|---|
|  | $\{(A1 - A2)/A2\} \times 100$ | $\{(C1 - C2)/C2\} \times 100$ | Mg concentration $[10^{19} \text{ cm}^{-3}]$ |
| Example 1 | 0.294 | −0.126 | 3.6 |
| Example 2 | 0.406 | −0.224 | 3.0 |
| Example 3 | 0.235 | −0.115 | 2.6 |
| Example 4 | 0.122 | −0.056 | 0.8 |
| Comperative Example 1 | 0.098 | −0.047 | 1.5 |
| Comperative Example 2 | 0.135 | −0.063 | 3.2 |
| Comperative Example 3 | 0.204 | −0.104 | 3.6 |

"A1": a-axis lattice constant of Mg-doping $Al_{0.7}Ga_{0.3}N$ layer
"A2": a-axis lattice constant of $Al_{0.7}Ga_{0.3}N$ layer
"C1": c-axis lattice constant of Mg-doping $Al_{0.7}Ga_{0.3}N$ layer
"C2": c-axis lattice constant of $Al_{0.7}Ga_{0.3}N$ layer Example 2

Except for changing bis(cyclopentadienyl) magnesium flow to 0.6 μmol/min, p-type AlGaN was produced under the same conditions as in Example 1. The obtained results are shown in Tables 1 to 2 and FIGS. 3 to 6.

Example 3

Except for changing bis(cyclopentadienyl) magnesium flow to 0.4 μmol/min, p-type AlGaN was produced under the same conditions as in Example 1. The obtained results are shown in Tables 1 to 2 and FIGS. 3 to 6.

Comparative Example 1

Except for changing bis(cyclopentadienyl) magnesium flow to 0.2 μmol/min, p-type AlGaN was produced under the same conditions as in Example 1. The obtained results are shown in Tables 1 to 2 and FIGS. 3 to 6.

Example 4

Except for changing bis(cyclopentadienyl) magnesium flow to 0.1 μmol/min, p-type AlGaN was produced under the same conditions as in Example 1. The obtained results are shown in Tables 1 to 2 and FIGS. 3 to 6.

Comparative Example 2

Except for changing growth temperature of Mg-doping $Al_{0.7}Ga_{0.3}N$ layer to 1200° C., p-type AlGaN was produced under the same conditions as in Example 1. The obtained results are shown in Tables 1 to 2.

Comparative Example 3

Except for changing growth temperature of Mg-doping $Al_{0.7}Ga_{0.3}N$ layer to 1000° C., p-type AlGaN was produced under the same conditions as in Example 1. The obtained results are shown in Tables 1 to 2.

From Table 1, activation energy in the after-mentioned T1 region was as low as 200 meV or less, and activation rate was as high as 0.001 or more in Examples 1, 2, 3 and 4.

FIGS. 2 and 3 show temperature dependency of the hole concentration and resistivity value in each of the examples and comparative example. As clearly shown in FIG. 2, while the hole concentration of Comparative Example 1 shows rectilinear change, the slope in the range where 1000/T is 2.0 to 3.3 (corresponding to 30 to 230° C., T1 region) is largely different from the slope in the range where 1000/T is 1.25 to 2.0 (corresponding to 230 to 525° C., T2 region) in Examples 1, 2, 3 and 4. It may indicate that conduction mechanism different from that of Comparative Example 1 is dominant in the range of 30 to 230° C.

Note that activation energy of Mg and activation rate of Mg (proportion of hole concentration to Mg concentration) in T1 and T2 regions shown in Table 1 were calculated by the following calculation formula.

Calculation Formula: $p = A \times \exp[Ea/(k_b T)]$ where p: hole concentration $[\text{cm}^{-3}]$, A: arbitrary constant, Ea: activation energy [meV], $k_b$: Boltzmann coefficient and T: temperature [K].

Also, from FIG. 3, resistivity values at around 30° C. were $5 \times 10^3$ Ω·cm or less in Example 4, and further 150 Ω·cm or less in Examples 1, 2 and 3. These were lower by 1 to 2 digits than those in conventional art.

Comparison Between Example 1 and Comparative Examples 2 to 3

As shown in Table 1, activation energy in Comparative Examples 2 and 3 was 400 meV or more and higher than that in Example 1. As a result, activation rate of Mg was lower by 2 or more digits than that in Example 1. Such remarkable differences in p-type semiconductor properties were caused by introduction of oxygen impurity and N defect, etc. in the Mg-doping layer due to producing in the crystal growth temperature out of the proper range, resulting in formation of many "donor-type compensation centers".

Comparison Between Examples 1 to 4 and Comparative Example 1

Figure 4:
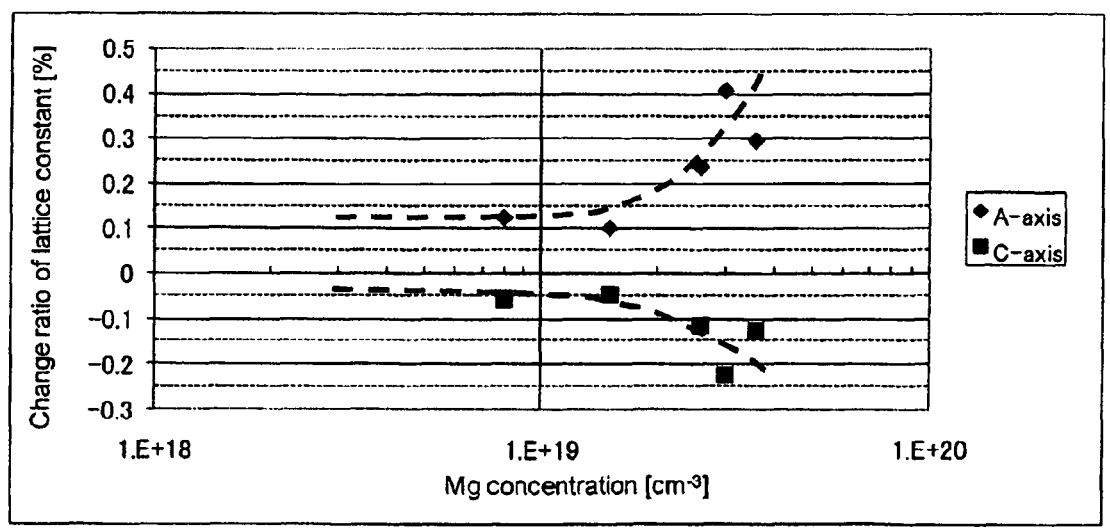
FIG. 4 is a graph showing a relationship of Mg concentration with "change ratio of a-axis crystal lattice constant" and "change ratio of c-axis crystal lattice constant".

The results of Table 2 are summarized in FIG. 4. As shown in FIG. 4, by doping Mg, the Mg-doping layer always had a tendency to lengthen to the a-axis direction or shorten to the c-axis direction compared to undoping samples. In addition, the amounts of change, i.e. "change ratio of a-axis crystal lattice constant" and "change ratio of c-axis crystal lattice constant", showed small variation but had a tendency to increase with increase in Mg concentration. Mg-doping amount was $1.5\times10^{19}$ cm$^{-3}$ in Comparative Example 1, however, crystal lattice deformation was relatively small when doping the above amount, and effects due to slight change in crystal growth conditions were relatively strong as described above. Therefore, although crystal growth conditions were the same as Example 4 except for making the doping amount larger, deformation volume of the crystal lattice deformation was inverted due to uncontrollable small differences in growth conditions, so that hole concentration/Mg concentration ratio was out of the range of the present invention.

Note that it was found from Table 2 that Mg concentrations in crystal were nearly identical in Example 1 and Comparative Examples 2 and 3 where flow condition of bis (cyclopentadienyl) magnesium was same, and that lattice constant of the Mg-doping layer was not largely different.

FIGS. 5 and 6 respectively show plots of hole concentration and resistivity value, obtained by Hall measurements at 30° C., to the above "change ratio of c-axis crystal lattice constant" and "change ratio of c-axis crystal lattice constant". As clearly shown in these figures, the "change ratios of a-axis crystal lattice constant" were 0.1% or more, and the "change ratios of c-axis crystal lattice constant" were −0.05% or less in Examples 1, 2, 3 and 4. Such change ratios resulted in rapid reduction of resistivity values and simultaneously, rapid increase in hole concentrations. The resistivity value and hole concentration were nearly constant, in which the "change ratio of a-axis crystal lattice constant" and the "change ratio of c-axis crystal lattice constant" were respectively 0.2% or more and −0.1% or less. On the other hand, in Comparative Example 1, the "change ratio of a-axis crystal lattice constant" was less than 0.01%, the "change ratio of c-axis crystal lattice constant" exceeded −0.05%, the resistivity value was extremely high and about $6.5\times10^{4}$ Ω·cm, and the hole concentration was as low as about $2.4\times10^{14}$ cm$^{-3}$.

The invention claimed is:

1. A p-type group III nitride semiconductor, characterized in that
an acceptor impurity atom in a concentration of $5\times10^{18}$ to $1\times10^{20}$ cm$^{-3}$ is doped in a group III nitride semiconductor having a composition expressed by $Al_XGa_YIn_ZN$, where each of X, Y and Z indicates a rational number satisfying $1.0>X\geq0.5$, $0.5\geq Y\geq0.0$ and $0.5\geq Z\geq0.0$, and satisfies a relationship of $X+Y+Z=1.0$,
a proportion of a hole concentration at 30° C. to an acceptor impurity atom concentration is 0.001 or more,
activation energy of said acceptor impurity atom in said p-type group III nitride semiconductor in a T1 region (30 to 230° C.) is smaller than activation energy thereof in a T2 region (230° C. to 525° C.), and
the activation energy of said acceptor impurity atom in said p-type group III nitride semiconductor in said T1 region is 200 meV or less.

2. The p-type group III nitride semiconductor as set forth in claim 1, wherein a resistivity value thereof at 30° C. is $5\times10^{3}$ Ωcm or less.

3. The p-type group III nitride semiconductor as set forth in claim 1, wherein the hole concentration thereof at 30° C. is $5\times10^{15}$ cm$^{-3}$ or more.

4. The p-type group III nitride semiconductor as set forth claim 1, wherein "A1" is larger than "A2" by 0.10% or more, or "C1" is smaller than "C2" by 0.05% or more when an a-axis lattice constant and a c-axis lattice constant of the p-type group III nitride semiconductor are defined as "A1" and "C1" respectively, and when an a-axis lattice constant and a c-axis lattice constant of a group III nitride semiconductor having same composition as said p-type group III nitride semiconductor but including no acceptor impurity are defined as "A2" and "C2" respectively.

5. The p-type group III nitride semiconductor as set forth in claim 1, produced by a metal organic chemical vapor deposition method.

6. A semiconductor element comprising at least one layer comprising the p-type group III nitride semiconductor as set forth in claim 1.

7. The p-type group III nitride semiconductor as set forth in claim 2, wherein the hole concentration thereof at 30° C. is $5\times10^{15}$ cm$^{-3}$ or more.

8. The p-type group III nitride semiconductor as set forth claim 2, wherein "A1" is larger than "A2" by 0.10% or more, or "C1" is smaller than "C2" by 0.05% or more when an a-axis lattice constant and a c-axis lattice constant of the p-type group III nitride semiconductor are defined as "A1" and "C1" respectively, and when an a-axis lattice constant and a c-axis lattice constant of a group III nitride semiconductor having same composition as said p-type group III nitride semiconductor but including no acceptor impurity are defined as "A2" and "C2" respectively.

9. The p-type group III nitride semiconductor as set forth claim 3, wherein "A1" is larger than "A2" by 0.10% or more, or "C1" is smaller than "C2" by 0.05% or more when an a-axis lattice constant and a c-axis lattice constant of the p-type group III nitride semiconductor are defined as "A1" and "C1" respectively, and when an a-axis lattice constant and a c-axis lattice constant of a group III nitride semiconductor having same composition as said p-type group III nitride semiconductor but including no acceptor impurity are defined as "A2" and "C2" respectively.

10. The p-type group III nitride semiconductor as set forth in claim 2, produced by a metal organic chemical vapor deposition method.

11. The p-type group III nitride semiconductor as set forth in claim 3, produced by a metal organic chemical vapor deposition method.

12. The p-type group III nitride semiconductor as set forth in claim 4, produced by a metal organic chemical vapor deposition method.

* * * * *